United States Patent
Ho et al.

[11] Patent Number: 5,997,324
[45] Date of Patent: Dec. 7, 1999

[54] EJECTING ROD ASSEMBLY FOR CARD HOLDER

[75] Inventors: Yu-Ming Ho, Pen-Chiao; Hung-Chi Yu, Taipei Hsien, both of Taiwan

[73] Assignee: Hon Hai Precision Ind. Co., Ltd., Taipei Hsien, Taiwan

[21] Appl. No.: 09/127,081

[22] Filed: Jul. 31, 1998

[30] Foreign Application Priority Data

Aug. 11, 1997 [TW] Taiwan ................................. 86213745

[51] Int. Cl.⁶ ........................................... H01R 13/62
[52] U.S. Cl. ........................................... 439/159
[58] Field of Search ................................ 439/159

[56] References Cited

U.S. PATENT DOCUMENTS 5,421,737  6/1995  Chen ........................................ 439/159
5,492,481  2/1996  Lewis ....................................... 439/159

*Primary Examiner*—Neil Abrams
*Assistant Examiner*—Javaid Nasri

[57] ABSTRACT

An ejecting rod assembly includes an elongate body defining a receiving groove therein. The receiving groove forms a closed end and an open end opposite to the closed end. A biasing spring is seated in the closed end, and an ejecting rod is movably received within the receiving groove and is biased by the spring during operation. A limiting tab is provided at the open end thereby eliminating upward movement of the ejecting rod from the open end of the receiving groove.

11 Claims, 5 Drawing Sheets

5,997,324

EJECTING ROD ASSEMBLY FOR CARD HOLDER

FIELD OF THE INVENTION

The present invention relates to an ejecting rod assembly, and more particularly to an ejecting rod assembly for use with a card holder of an I/O card connector.

DESCRIPTION OF THE PRIOR ART

I/O cards provide all the functional options and flexibility of conventional expansion cards except that the I/O card is encased within a thin, compact unit facilitating insertion and withdrawal from a connecting device such as an I/O card connecting cartridge. Taiwan Utility Model application Nos. 83202198, and 85218632, and U.S. Pat. Nos. 5,286,207, 5,290,174 and 5,334,046 disclose such connecting cartridges. However, the conventional connecting cartridge may be subject to adverse defects during manufacture and operation. If the connecting cartridge functions improperly, the data stored within the I/O card can not be retrieved.

FIG. 1 is an exploded view of a conventional connector cartridge which includes a card holder 1, a connector 2, and an EMI shield 3. The card holder 1 includes a guiding arm 11, an actuating arm assembly 12, and an ejecting mechanism 13 bridged between the guiding arm 11 and the ejecting mechanism 12.

As shown in FIG. 2, the actuating arm assembly 12 generally includes a housing 12a defining a groove 12b therein. A biasing spring 12c is seated in an end (not labeled) of said groove 12b. An actuator 12d is movably received within the groove 12b and is biased by the spring 12c during operation. A metal plate 12e encloses the groove 12b thereby limiting the actuator 12d within the groove 12b. The housing 12a defines a mounting groove 12f in which an extended end wall 13a of the ejecting mechanism 13 can be securely retained therein. The housing 12a defines a guiding groove 12g in a side thereof for guiding an inserted I/O card (not shown).

Ideally, the metal plate 12e sustains no upward force from the actuator 12d if the external actuating force aligns with the axis of the actuator 12d. However, some careless users may adversely manipulate the actuator 12d rendering an upward movement thereof. Thus, the metal plate 12e may disengage from the housing 12a at an open end 12h thereof which causes an actuating end 12i of the actuator 12d to inadequately contact the ejecting mechanism 13 thereby hindering the withdrawal of the I/O card therefrom. Furthermore, an opposite end of the housing 12a may experience a deformation during a molding process resulting in an open end which is not suitable for delivery. Hence, an ejecting rod assembly for a card holder is required which can overcome the defects of the conventional assembly described above.

SUMMARY OF THE INVENTION

An objective of this invention is to provide an ejecting rack assembly to ensure a reliable engagement between an ejecting rod and an ejecting mechanism for facilitating effective withdrawal of an I/O card from a card holder.

Another objective of this invention is to provide an ejecting head detachably connected to an end of the ejecting rod.

In order to achieve the objectives set forth, an ejecting rod assembly includes an elongate body defining a receiving groove therein and a biasing spring seated in an end thereof. The receiving groove forms a closed end and an open end opposite the closed end. An ejecting rod is movably received within the receiving groove and is biased by the spring during operation. A metal cover encloses at least a part of the groove thereby limiting unwanted upward movement of the ejecting rod within the groove. A limiting tab provided at the open end eliminates the upward movement of the ejecting rod from the open end of the receiving groove. The provision of the limiting tab also prevents deformation of the receiving groove.

These and additional objects, features, and advantages of the present invention will become apparent after reading the following detailed description of the preferred embodiment of the invention taken in conjunction with the appended drawings.

DETAILED DESCRIPTION OF THE PREFERRED EMBODIMENTS

Figure 1:
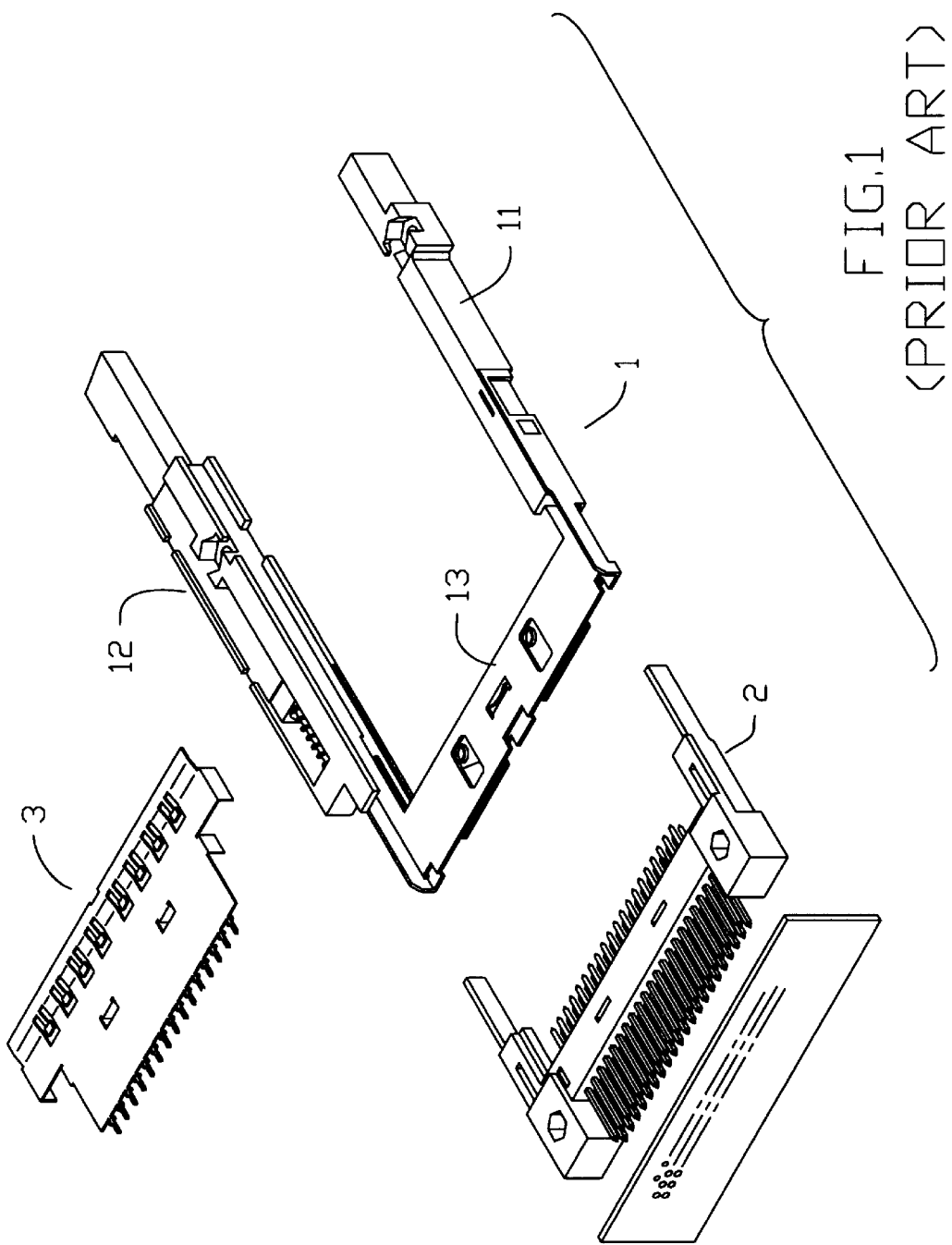
FIG. 1 is an exploded view of a conventional card cartridge.
Figure 2:
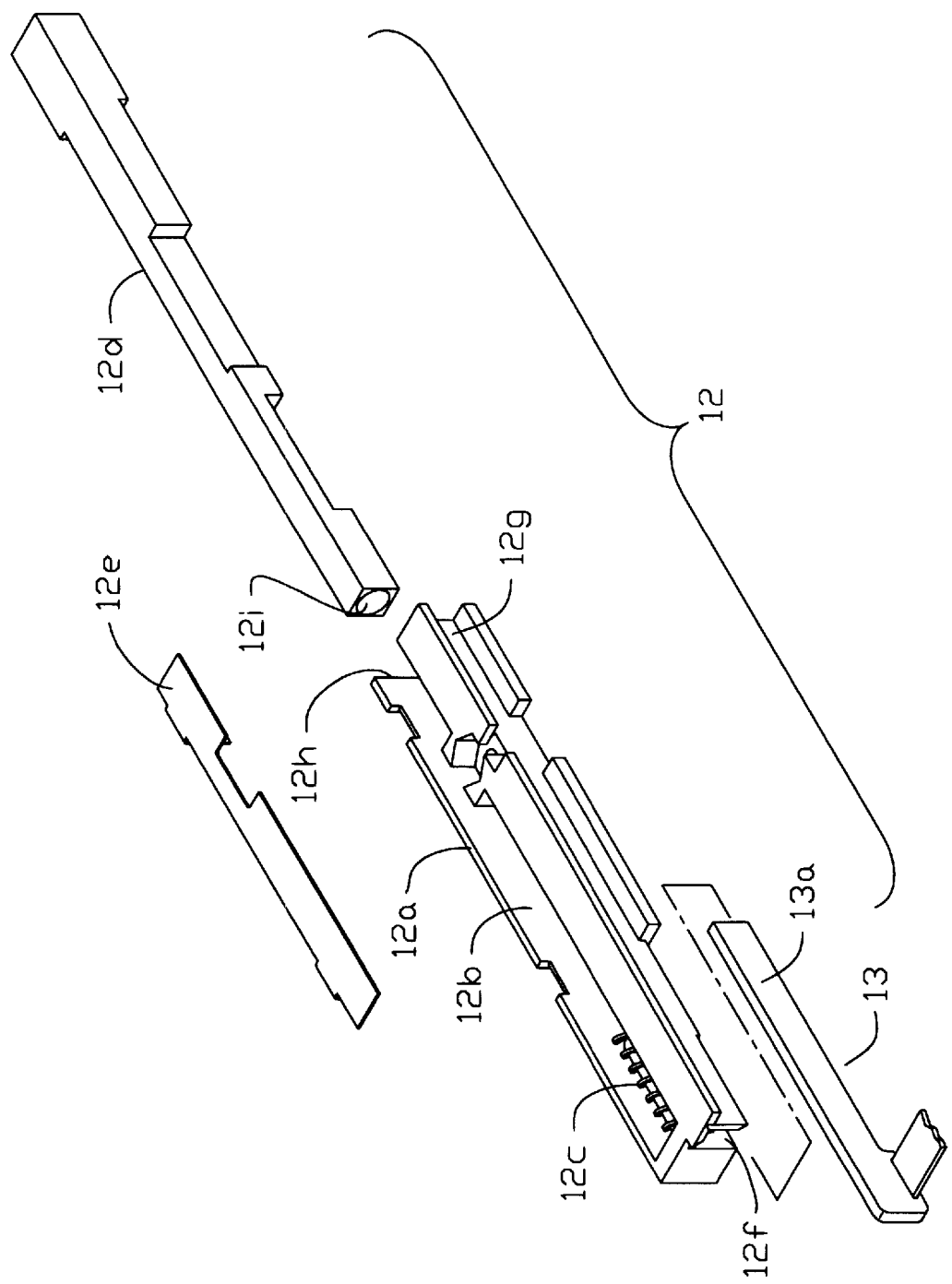
FIG. 2 is an exploded view of an actuating arm assembly of the card cartridge shown in FIG. 1.
Figure 3:
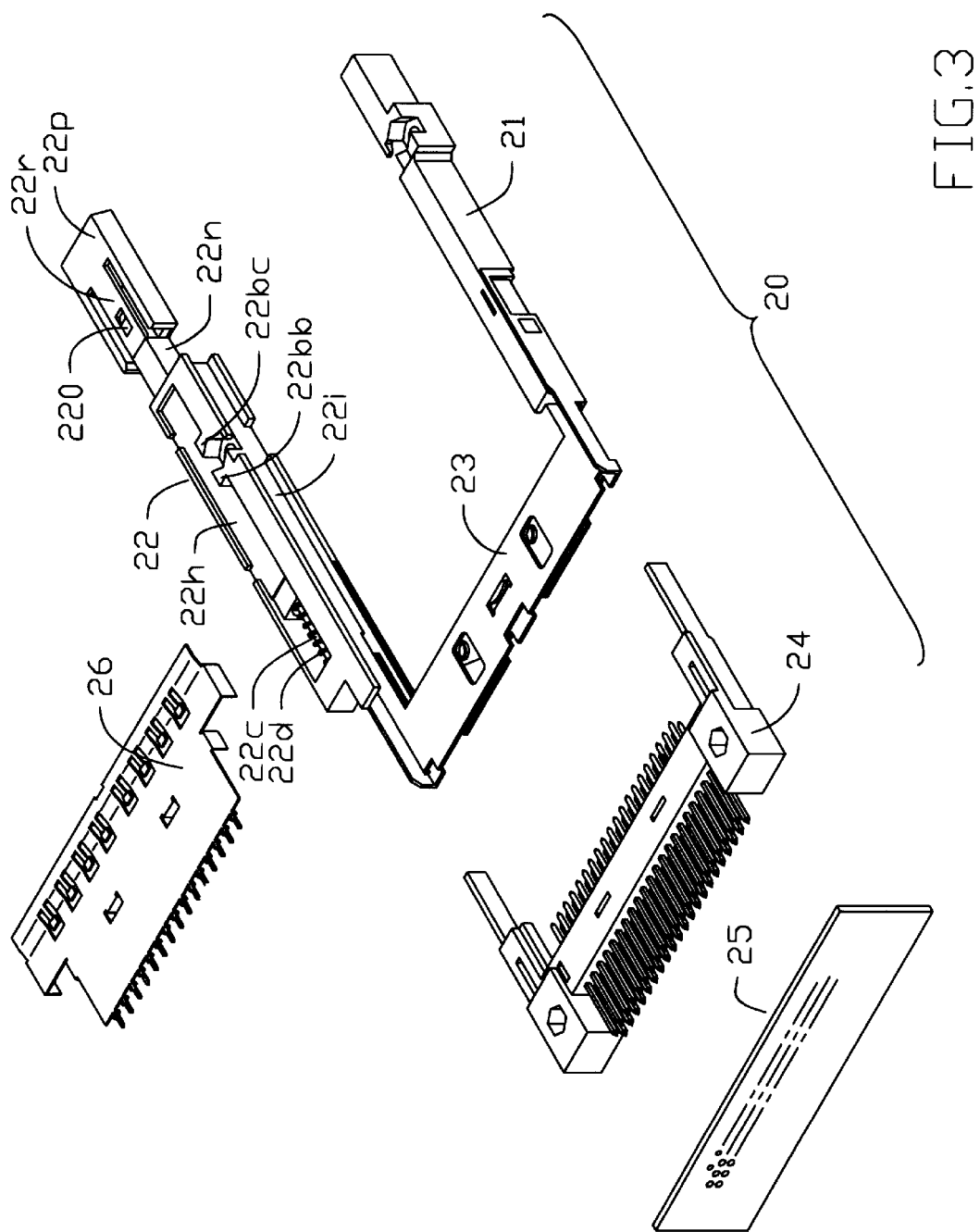
FIG. 3 is an exploded view of a card cartridge in accordance with the present invention.
Figure 4:
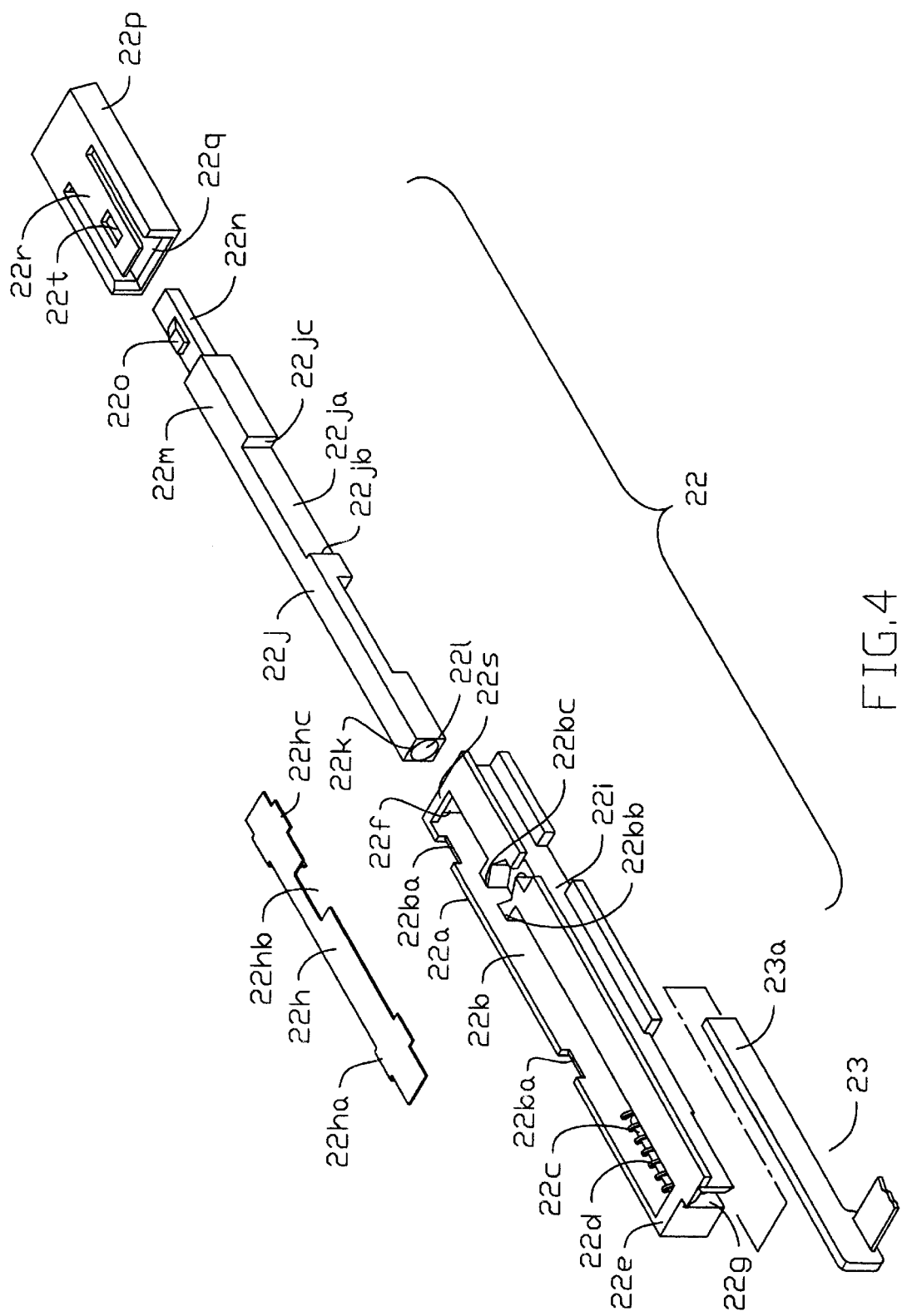
FIG. 4 is an exploded view of an ejecting rod assembly in accordance with the present invention.

Referring to FIGS. 3 and 4, a connector cartridge 20 includes a guiding rod 21, an ejecting rod assembly 22, an ejecting mechanism 23 bridged between the guiding rod 21 and the ejecting rod assembly 22, a connector 24, a printed circuit board 25, and an EMI shield 26.

As shown in FIG. 4, the ejecting rod assembly 22 generally includes an elongate housing 22a defining a receiving groove 22b therein. A biasing spring 22d is disposed in a seat 22c of said groove 22b. An ejecting rod 22j is movably received within the groove 22b and is biased by the spring 22d during operation. The groove 22b forms a cutout 22ba in a sidewall thereof and a pair of projections 22bb, 22bc projecting into the groove 22b. The housing 22a forms a mounting recess 22g for fixedly retaining an extended end wall 23a of the ejecting mechanism 23. The housing 22a forms a side groove 22i for guiding an I/O card inserted therein. The housing 22a forms a closed end 22e and an open end 22f. A reinforced rib 22s is formed at the open end 22f to increase the overall rigidity of the housing 22a. As a result, the risk of the deformation of the housing 22a during a molding procedure is eliminated.

The ejecting rod 22j has an elongate shape and forms an actuating end 22k and a mating end 22m. The ejecting rod 22j defines a hole 22l in the actuating end 22k for receiving the spring 22d and the seat 22c. The hole 22l includes a shoulder (not shown) to bias the spring 22d. The ejecting rod 22j forms a cutout 22ja defining by a front wall 22jb and a rear wall 22jc for contacting the projections 22bb, 22bc, respectively. Accordingly, the movement of the ejecting rod 22j within the groove 22b is limited. The ejecting rod 22j further includes a coupling wedge 22n on which a buckle 22o is formed. A push button 22p is detachably connected to the coupling wedge 22n. The push button 22p forms a recess 22q for receiving the coupling wedge 22n therein and a latch 22r cantilevered from an end of the recess 22q. The latch 22r forms an opening 22t for engaging with the buckle 22o of the coupling wedge 22n.

A metal plate 22h forms at least a clip 22ha extending downward from a side thereof and a tab 22hc extending horizontally from an opposite side. The clip 22ha can be fixedly engaged with a fastener (not shown) and the tab 22hc can be firmly retained within a slot (not shown) of the housing 22a. By this arrangement, movement of the ejecting rod 22j can be limited within the groove 22b and the upward movement thereof can be eliminated.

Figure 5:
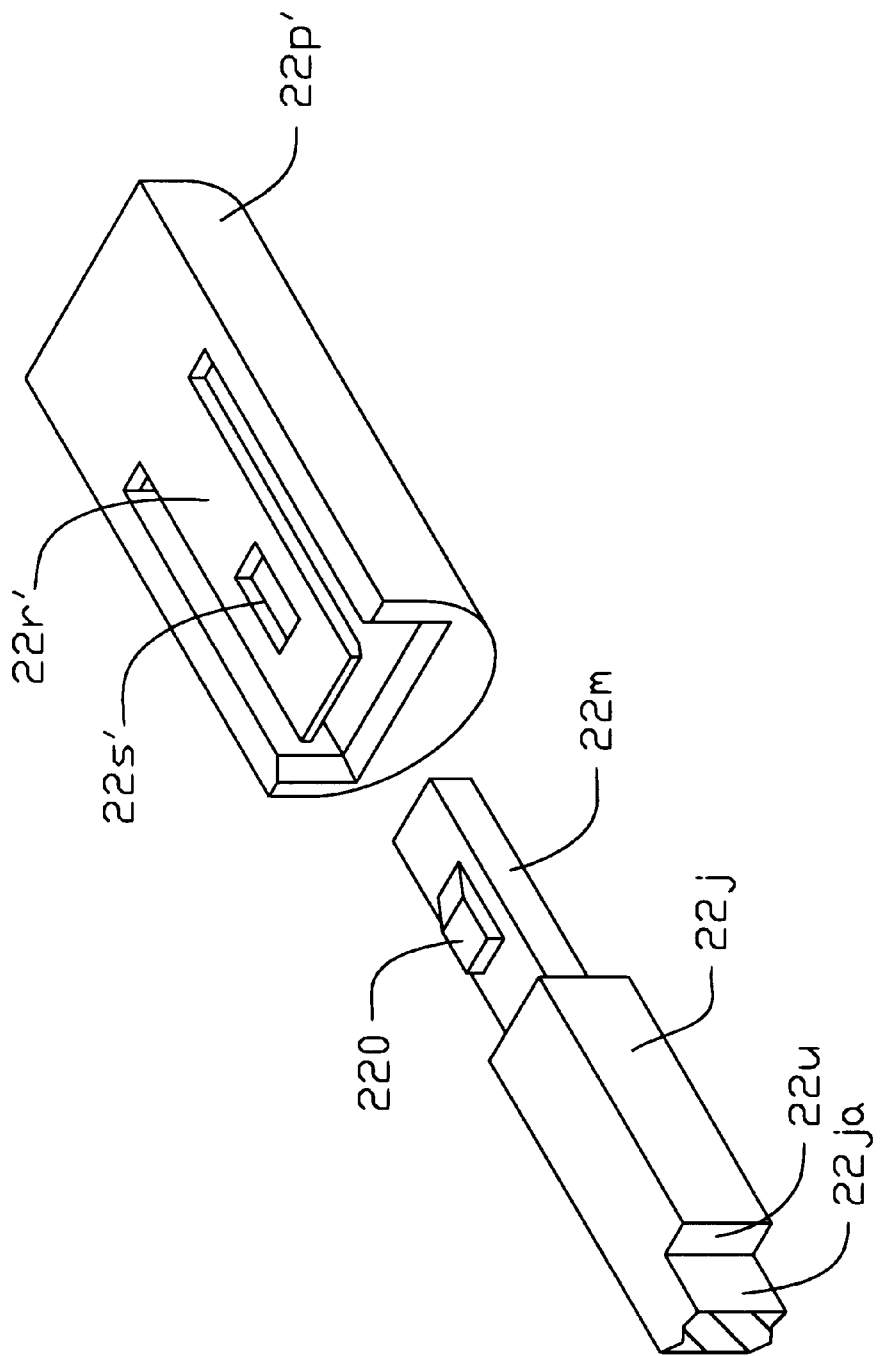
FIG. 5 is a partial exploded view showing a second embodiment of a push button of the ejecting rod assembly in accordance with the present invention.

As shown in FIG. 5, a second embodiment of the push button 22p' has a configuration similar to the push button 22p except for the semi-circular shape of a bottom portion thereof.

In assembly, the actuating end 22k is inserted through the open end 22f of the housing 22a. The actuating end 22k is then elevated over the projections 22bb, 22bc and moved toward the closed end 22e until the cutout 22ja of the ejected rod 22j can receive the projections 22bb, 22bc therein. The ejecting rod 22j then is movably seated within the groove 22b of the housing 22a. After the ejecting rod 22j is completely seated, the metal plate 22h is attached to the housing 22a to enclose the groove 22b. Under this situation, the projections 22bb, 22bc of the housing 22a are received within the cutout 22ja of the ejecting rod 22j, and the ejecting rod 22j can be movable with regard to the housing 22a within a limited range defined by engagement between the projections 22bb, 22bc and the front wall 22jb and the rear wall 22jc of the ejecting rod 22j.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims. Therefore, persons of ordinary skill in this field are to understand that all such equivalent structures are to be included within the scope of the following claims.

We claim:

1. An ejecting rod assembly for use with a card holder, comprising an elongate body defining a receiving groove therein, said receiving groove forming a closed end and an open end opposite to the closed end, said receiving groove forming a seat at said closed end for receiving a spring thereon, an ejecting rod being moveably received within said receiving groove and being biased by said spring during operation, said ejecting rod having an elongate shape and forming an actuating end and a mating end, said ejecting rod further including a coupling wedge having a buckle thereon at said mating end, and a limiting tab being provided at said open end thereby eliminating upward movement of said ejecting rod from said open end of said receiving groove.

2. An ejecting rod assembly as recited in claim 1, wherein a push button is detachably connected to said coupling wedge.

3. An ejecting rod assembly as recited in claim 2, wherein said push button forms a recess for receiving said coupling wedge therein and a latch cantilevered from an end of said recess, said latch forming an opening engaged with said buckle of said coupling wedge.

4. An ejecting rod assembly as recited in claim 1, wherein said ejecting rod assembly includes a metal cover enclosing at least a part of said receiving groove.

5. An ejecting rod assembly as recited in claim 1, wherein the body includes a protrusion and the ejecting rod defines a cutout with a front wall and a rear wall, so that the projection can be restrainedly movable within said cutout with a limited range defined by engagement between the protrusion and the front wall or the rear wall.

6. A connector cartridge for receiving an I/O card therein comprising a guiding rod, an ejecting rod assembly, an ejecting mechanism bridged between said guiding rod and said ejecting rod assembly, a connector, a printed circuit board, and an EMI shield, said ejecting rod assembly comprising an elongate body defining a receiving groove therein, said receiving groove forming a closed end and an open end opposite to the closed end, said receiving groove forming a seat at said closed end for receiving a spring thereon, an ejecting rod being movably received within said receiving groove and being biased by said spring during operation, said ejecting rod having an elongate shape and forming an actuating end and a mating end, said ejecting rod further including a coupling wedge having a buckle thereon at said mating end, and a limited tab being provided at said open end thereby eliminating upward movement of said ejecting rod from said open end of said receiving groove.

7. A connector cartridge as recited in claim 6, wherein a push button is detachably connected to said coupling wedge.

8. A connector cartridge as recited in claim 7, wherein said push button forms a recess for receiving said coupling wedge therein and a latch cantilevered from an end of said recess, said latch forming an opening engaged with said buckle of said coupling wedge.

9. A connector cartridge as recited in claim 6, wherein said ejecting rod assembly includes a metal cover enclosing at least a part of said receiving groove.

10. An ejecting rod assembly as recited in claim 6, wherein the body includes a protrusion and the ejecting rod defines a cutout with a front wall and a rear wall, so that the projection can be restrainedly movable within said cutout with a limited range defined by engagement between the protrusion and the front wall or the rear wall.

11. An ejecting rod assembly for use with a card holder, comprising an elongate body defining a receiving groove therein, said receiving groove forming a closed end and an open end opposite to the closed end, said receiving groove forming a seat at said closed end for receiving a spring thereon, an ejecting rod being movably received within said receiving groove and being biased by said spring during operation, said ejecting rod defining an elongate shaped and forming an actuating end and a mating end, and a push button being detachably connected to said mating end.

* * * * *